(12) United States Patent
Strueder et al.

(10) Patent No.: US 7,838,837 B2
(45) Date of Patent: Nov. 23, 2010

(54) SEMICONDUCTOR DETECTOR FOR RADIATION DETECTION, AND ASSOCIATED OPERATING METHOD

(75) Inventors: Lothar Strueder, Munich (DE); Peter Holl, Munich (DE); Gerhard Lutz, Munich (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 51 days.

(21) Appl. No.: 12/147,768

(22) Filed: Jun. 27, 2008

(65) Prior Publication Data
US 2009/0001274 A1 Jan. 1, 2009

(30) Foreign Application Priority Data
Jun. 28, 2007 (DE) .................. 10 2007 029 898

(51) Int. Cl.
*H01L 27/148* (2006.01)
(52) U.S. Cl. .................................. 250/370.14
(58) Field of Classification Search ............. 250/370.14
See application file for complete search history.

(56) References Cited

U.S. PATENT DOCUMENTS

| 3,971,003 | A | | 7/1976 | Kosonocky | |
|---|---|---|---|---|---|
| 5,049,960 | A | | 9/1991 | Miwada | |
| 5,576,763 | A | * | 11/1996 | Ackland et al. | 348/308 |
| 7,268,814 | B1 | * | 9/2007 | Pain et al. | 348/294 |
| 2002/0175269 | A1 | * | 11/2002 | Krymski | 250/208.1 |
| 2004/0099886 | A1 | * | 5/2004 | Rhodes et al. | 257/222 |
| 2004/0174449 | A1 | * | 9/2004 | Lee et al. | 348/308 |
| 2006/0138489 | A1 | * | 6/2006 | Ahn et al. | 257/292 |
| 2006/0192261 | A1 | * | 8/2006 | Sze et al. | 257/431 |
| 2008/0175045 | A1 | * | 7/2008 | Lin | 365/182 |

FOREIGN PATENT DOCUMENTS

| DE | 2551795 C2 | 5/1976 |
|---|---|---|
| EP | 1081766 A1 | 3/2001 |

OTHER PUBLICATIONS

Fiorini et al., "Continous Charge Restoration in Semiconductor Detectors by Means of the Gate-to-Drain Current of the Integrated Front-End JFET", IEEE Transactions on Nuclear Science, vol. 46 (1999), pp. 761-764.

(Continued)

*Primary Examiner*—David P Porta
*Assistant Examiner*—Shun Lee
(74) *Attorney, Agent, or Firm*—Caesar, Rivise, Bernstein, Cohen & Pokotilow, Ltd.

(57) ABSTRACT

The invention relates to a semiconductor detector, in particular a pnCCD detector, for radiation detection, including a guard ring (12, 14) and a readout anode (3, 4) arranged inside the guard ring (12, 14) for reading out radiation-generated signal charge carriers (e−), and also including a clearing contact (9) arranged outside the guard ring (12, 14) for removing the collected signal charge carriers (e−) from the readout anode (3, 4). According to the invention, the semiconductor detector furthermore includes a gap (15, 16) in the guard ring (12, 14) and also a controllable gate (17, 18) which is arranged over the gap (15, 16) in the guard ring (12, 14) and makes the gap (15, 16) in the guard ring (12, 14) permeable or impermeable to the signal charge carriers (e−) to be removed, depending on an electrical actuation of the gate (17, 18).

22 Claims, 2 Drawing Sheets

OTHER PUBLICATIONS

Lutz et al., "Semiconductor Radiation Detectors", (Springer Verlag, 2001), pp. 137-152.

Pinotti et al., "The pn-CCD on-chip electronics", Nuclear Instruments and Methods in Physics Research A326 (1993), pp. 85-91.

* cited by examiner

SEMICONDUCTOR DETECTOR FOR RADIATION DETECTION, AND ASSOCIATED OPERATING METHOD

BACKGROUND OF THE INVENTION

The invention relates to a semiconductor detector for radiation detection and also to an associated operating method.

From Gerhard Lutz: "Semiconductor Radiation Detectors", 2nd edition 2001, Springer-Verlag, pages 144-152, pnCCD detectors are known in which the incident radiation in a pnCCD structure generates signal electrons which are transported along the pnCCD structure to a readout anode. Such pnCCD detectors on highly resistive n-doped silicon have reached a level of maturity close to their physical limits. For example, the noise of the best pnCCD detectors is just 1.5 electrons at a power consumption of approx. 0.3 mW per channel.

This good noise behavior can be achieved in the conventional pnCCD detectors by a capacitance-free clearing mechanism which is described for example in Carlo Fiorini, Peter Lechner: "Continuous Charge Restoration in Semiconductor Detectors by Means of the Gate-to-Drain Current of the Integrated Front-End JFET", IEEE Transactions on Nuclear Science, Vol. 46, No. 3, June 1999, pages 761-764. With this clearing mechanism, the readout anode of the pnCCD detector is reset to its original potential through a so-called "Weak Avalanche" process by means of a JFET transistor (JFET: Junction Field Effect Transistor). However, this conventional clearing mechanism is unsuitable for clearing large signal charge quantities. Furthermore, this conventional clearing mechanism does not allow rapid clearing of the signal charges in the nanosecond range.

Another clearing mechanism for a pnCCD detector is known from Pinotti, E. et al.: "The pn-CCD on-chip electronics", Nuclear Instruments and Methods in Physics Research A326 (1993) 85-91, in which the signal charge carriers are removed from the readout anode of the pnCCD detector by an integrated field effect transistor. However, this clearing mechanism has a disadvantageous effect on the capacitance of the readout anode.

The object of the invention is therefore to create a semiconductor detector with an improved clearing mechanism and to provide a correspondingly improved operating method for such a semiconductor detector. Here, the clearing mechanism according to the invention should preferably be capacitance-free and should allow rapid clearing of large signal charge quantities in the nanosecond range.

This object is achieved by a semiconductor detector according to the invention and by a corresponding operating method.

SUMMARY OF THE INVENTION

In the semiconductor detector according to the invention, the clearing mechanism comprises a guard ring which surrounds a readout anode, wherein the readout anode serves in a conventional manner for reading out radiation-generated signal charge carriers. The clearing mechanism according to the invention also comprises a clearing contact which is arranged outside the guard ring and serves in a conventional manner for removing the collected signal charge carriers from the readout anode, in order to reset the readout anode to its original electric potential. In contrast to the conventional pnCCD detectors with a guard ring surrounding the readout anode, however, the guard ring in the semiconductor detector according to the invention is not closed in a ring shape but rather includes a gap. According to the invention, a controllable gate is arranged over the gap in the guard ring and makes the gap in the guard ring permeable or impermeable to the signal charge carriers to be removed, depending on an electrical actuation of the gate.

The term "guard ring" used in the context of the invention is not limited to ring-shaped structures in the narrower geometric sense, which are circular or oval. Instead, the guard ring in the semiconductor detector according to the invention may also be rectangular or have the shape of a polygon, to mention just a few examples. Preferably, however, the guard ring is a doped implantation in a semiconductor substrate, wherein the implantation of the guard ring surrounds the readout anode.

Hereinbelow, the electrical actuation of the gate over the gap in the guard ring will be described by way of example for the case where the guard ring is p-doped while the readout anode is n-doped.

In a readout mode, the gate over the gap in the guard ring is actuated in such a way that the gap is impermeable to the signal charge carriers. To this end, in the case of the doping mentioned above, a negative voltage is applied to the gate over the gap, as a result of which a hole inversion layer is generated in the gap of the guard ring, which hole inversion layer electrically isolates the readout anode from the clearing contact. In the readout mode, therefore, the clearing contact is unable to convey signal charge carriers away from the readout anode.

On the other hand, in a reset or clearing mode, the gate over the gap in the guard ring is actuated in such a way that the gap is permeable to the signal charge carriers to be removed, so that the clearing contact is able to remove the signal charge carriers from the readout anode. To this end, in the case of the doping mentioned above, a positive electrical voltage is applied to the gate over the gap in the guard ring, as a result of which an electron accumulation layer is generated in the gap in the guard ring and creates an electrically conductive passage from the clearing contact to the readout anode.

In one preferred example of an embodiment of the invention, the semiconductor detector comprises a plurality of readout anodes which may in each case be assigned for example to one detector row or to one detector column. In this case, the individual readout anodes are in each case arranged inside a guard ring, wherein the individual guard rings each have a gap which can be made permeable or impermeable to the signal charge carriers by means of a controllable gate in each case.

In this example of an embodiment comprising a plurality of readout anodes, preferably one clearing contact is responsible for removing the signal charge carriers from a plurality of readout anodes. By way of example, one clearing contact may be arranged between two adjacent readout anodes, which clearing contact removes the signal charge carriers from the two adjacent readout anodes. In this case, the gaps in the two guard rings preferably face towards the clearing contact located in the center, in order to facilitate the clearing of the signal charge carriers.

In the above-described example of embodiment comprising a plurality of guard rings with gaps and a plurality of associated gates, the individual gates are preferably jointly electrically contacted and are accordingly at the same potential. The gaps in the individual guard rings can therefore be made permeable or impermeable to the signal charge carriers by a joint actuation of the associated gates by a common control signal. The invention therefore also comprises an associated control unit for electrically actuating the gate over the gap in the guard ring and for actuating the clearing contact.

In one variant of the invention, this control unit controls both the gate over the gap in the guard ring and the clearing contact with a DC voltage signal.

On the contrary, in another variant of the invention, the control unit controls both the gate over the gap in the guard ring and the clearing contact with an AC voltage signal.

Furthermore, one variant of the invention provides that the control unit actuates the clearing contact with a DC voltage signal, whereas the control unit actuates the gate over the gap in the guard ring with an AC voltage signal.

It is moreover provided in a further variant of the invention that the control unit actuates the clearing contact with an AC voltage signal, whereas the control unit actuates the gate over the gap in the guard ring with a DC voltage signal.

One advantage of the above-described clearing mechanism according to the invention is the short clearing time that is required in order to remove the collected radiation-generated signal charge carriers almost completely from the readout anode, apart from charge carriers caused by noise. For instance, the required clearing time in the case of the clearing mechanism according to the invention is preferably less than 100 ns, 50 ns, 30 ns, 20 ns, 10 ns or even less than 5 ns. During the clearing time, the gate over the gap in the guard ring is actuated in such a way that the gap is permeable to the signal charge carriers. Furthermore, during the clearing time, the clearing contact is actuated in such a way that the signal charge carriers are removed from the readout anode and pass through the gap in the guard ring to the clearing contact.

Another advantage of the clearing mechanism according to the invention is that no stray capacitance is impressed on the input node of a source-follower amplifier.

A further advantage of the clearing mechanism according to the invention is the fact that the dissipation loss of an amplifying JFET is not affected.

Furthermore, the semiconductor detector according to the invention preferably comprises a plurality of CCD image cell rows (CCD: Charge Coupled Device), each comprising a plurality of image cells arranged one behind the other, wherein the incident radiation in the individual image cells generates signal charge carriers which are further transported along the CCD image cell rows, with a respective readout anode being arranged at the end of the CCD image cell rows. Such CCD detectors are known per se and are described for example in the previously cited textbook Gerhard Lutz: "Semiconductor Radiation Detectors", 2nd edition 2001, Springer-Verlag, pages 137-152, which can be fully attributed to the present description with regard to the structure and functioning of CCD detectors, so that there is no need at this point for a detailed description of CCD detectors. The individual CCD image cell rows may in this case respectively open into transport channels, in which the radiation-generated signal charge carriers are further transported.

Furthermore, the semiconductor detector according to the invention preferably comprises an amplifier which is connected to the readout anode, wherein the amplifier may optionally be integrated on the semiconductor substrate of the semiconductor detector or may be designed as a separate component.

In the semiconductor detector according to the invention, the gate over the gap in the guard ring therefore forms, together with the readout anode and the clearing contact, a MOSFET transistor with the readout anode as the source and the clearing contact as the drain and the gap in the guard ring as a controllable conducting channel.

The MOSFET transistor may in this case optionally be designed to be normally off or normally on.

Furthermore, the MOSFET transistor may optionally be an n-channel MOSFET transistor or a p-channel MOSFET transistor.

It should moreover be mentioned that, when implemented in practice, the readout anode, the guard ring, the clearing contact and the gate over the gap in the guard ring are arranged on a surface of a semiconductor substrate.

The clearing contact, the semiconductor substrate and the readout anode are in this case doped according to a first type of doping, while the guard ring is doped according to a second type of doping.

In the context of the invention, the first type of doping may be an n-doping, while the second type of doping may be a p-doping.

However, in the context of the invention, it is also possible as an alternative that the first type of doping is a p-doping, while the second type of doping is an n-doping. In this case, the abovementioned voltages for readout and clearing must also be accordingly reversed.

It should also be mentioned that the semiconductor detector according to the invention is preferably formed on an n-type semiconductor (e.g. silicon), the signal charge carriers being electrons.

However, it is also possible as an alternative to form the semiconductor detector according to the invention on a p-type semiconductor, the signal charge carriers being holes.

In addition to the above-described semiconductor detector according to the invention, the invention also comprises a corresponding operating method, in which the gate over the gap in the guard ring is accordingly actuated in order to make the gap permeable or impermeable to the signal charge carriers to be removed, as already described above.

The invention also comprises the novel use of a MOSFET transistor known per se for controlling the signal charge carrier permeability of a gap in a guard ring which surrounds a readout anode of a semiconductor detector.

Finally, it should also be mentioned that the semiconductor detector according to the invention is suitable not only for detecting photon radiation, but rather in general for detecting ionizing radiation which generates electron/hole pairs and thus free signal charge carriers (electrons or holes) in the semiconductor detector. By way of example, the radiation to be detected may be alpha radiation, beta radiation, gamma radiation or cosmic radiation.

BRIEF DESCRIPTION OF THE DRAWINGS

Other advantageous further developments of the invention are characterized in the dependent claims or will be explained in more detail below in conjunction with the description of a preferred example of embodiment of the invention and with reference to the figures, in which:

DETAILED DESCRIPTION OF PREFERRED EMBODIMENTS

Figure 1:
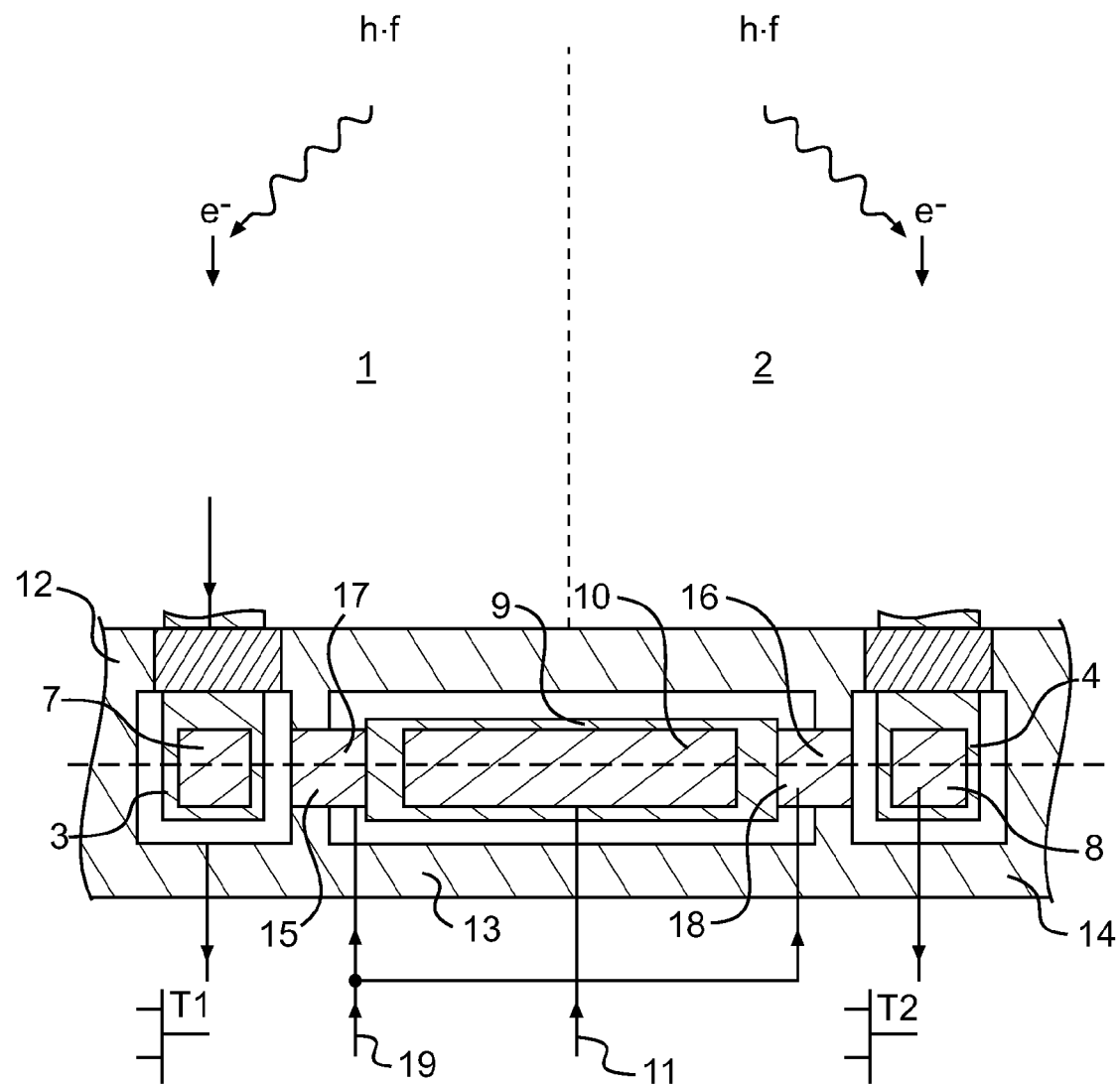
FIG. 1 shows a plan view of part of a pnCCD semiconductor detector according to the invention.

The figures show part of a pnCCD semiconductor detector comprising a plurality of transport channels 1, 2 arranged in parallel next to one another, wherein the transport channels 1, 2 may be designed in a conventional manner and are therefore shown only schematically here. In the individual image cells of the CCD image cell rows, the incident radiation h·f generates signal electrons e⁻, which are then transported in a conventional manner in the direction of the arrow along the transport channels 1, 2 to a respective readout anode 3, 4.

The readout anodes 3, 4 essentially consist of an n-doped implantation on an upper side of an n-doped semiconductor substrate 5, wherein the semiconductor substrate 5 has on a rear side a p-doped back electrode 6 in order to completely deplete the semiconductor substrate 5 during operation.

Furthermore, the readout anodes 3, 4 have on their upper side a respective metal contact 7, 8, via which the readout anodes 3, 4 are connected to a respective transistor amplifier T1, T2, wherein the transistor amplifiers T1, T2 are shown only schematically here and may also be integrated on the semiconductor substrate 5 as on-chip amplifiers.

Arranged between the two readout anodes 3, 4 is a common clearing contact 9 which likewise consists of an n-doped implantation on the upper side of the semiconductor substrate 5 and has on its upper side a metal contact 10, to which a clearing voltage can be applied via a control line 11 in order to remove the signal electrons e⁻ from the readout anodes 3, 4.

The readout anodes 3, 4 and the clearing contact 9 are in each case surrounded by a guard ring 12, 13, 14, wherein the guard ring 12 surrounds the readout anode 3 while the guard ring 14 surrounds the readout anode 4. The guard ring 13 on the other hand surrounds the clearing contact 9 and is arranged between the two guard rings 12, 14 of the readout anodes 3, 4, wherein the guard rings 12, 13, 14 are formed by a common p-doped implantation on the upper side of the semiconductor substrate 5.

The guard ring 12 around the readout anode 3 has a gap 15 on the side facing towards the clearing contact 9, so that the guard ring 12 is not completely closed. The gap 15 in the guard ring 12 is intended here to make it possible for the clearing contact 9 to remove the signal electrons e⁻ from the readout anode 3, as will be described in further detail below.

The guard ring 14 around the readout anode 4 likewise has a gap 16 on the side facing towards the clearing contact 9, the gap 16 having the same function as the gap 15 in the guard ring 12.

Arranged across the two gaps 15, 16 is a respective gate 17, 18 made of metal or polysilicon, wherein the two gates 17, 18 can be actuated via a common control line 19 in order to control the permeability of the gaps 15, 16 to the signal electrons e⁻, as will be described in further detail below.

Figure 2A:
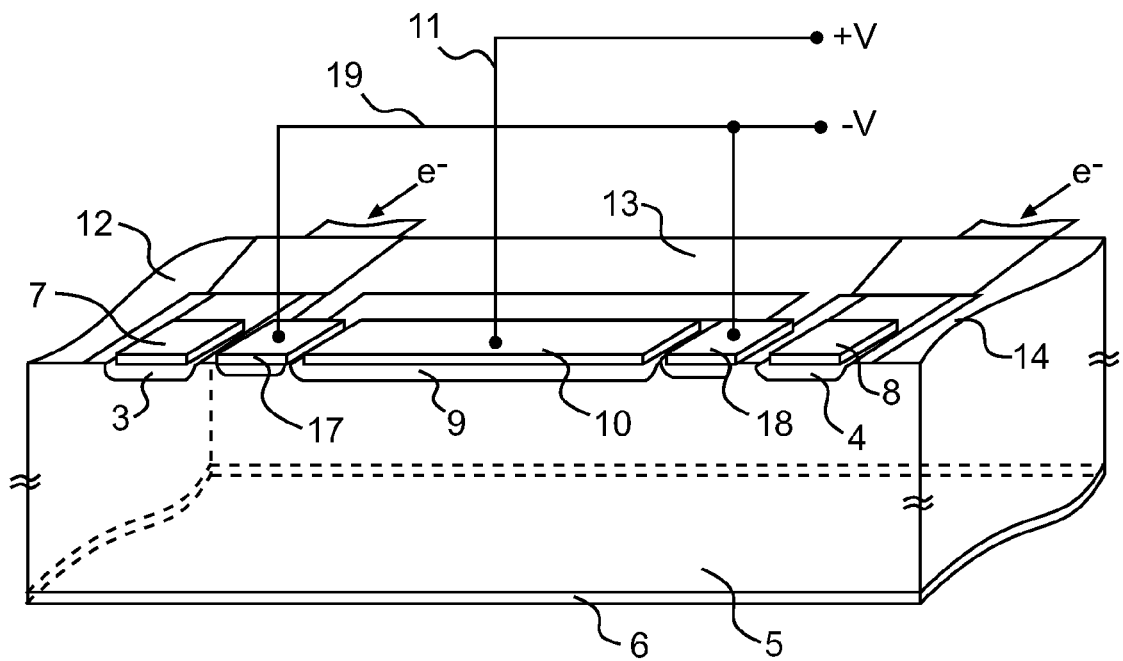
FIG. 2A shows a perspective view of the pnCCD semiconductor detector according to FIG. 1 in a readout mode in which the radiation-generated signal charge carriers are read out.

There will now be described, with reference to FIG. 2A, a readout mode of the pnCCD semiconductor detector, in which the radiation-generated signal electrons e⁻ are read out by the transistor amplifiers T1, T2 via the readout anodes 3, 4.

In the readout mode, the gaps 15, 16 in the guard rings 12, 14 around the readout anodes 3, 4 should be impermeable to the signal electrons e⁻, so that all of the radiation-generated signal electrons e⁻ contribute to the actuation of the transistor amplifiers T1, T2.

Via the common control line 19, a negative voltage −V is therefore applied to the gates 17, 18 over the gaps 15, 16 in the guard rings 12, 14 and generates in the gaps 15, 16 a hole inversion layer and thus makes the gaps 15, 16 electrically non-conductive. In the readout mode, the clearing contact 9 is therefore electrically isolated from the readout anodes 3, 4.

Figure 2B:
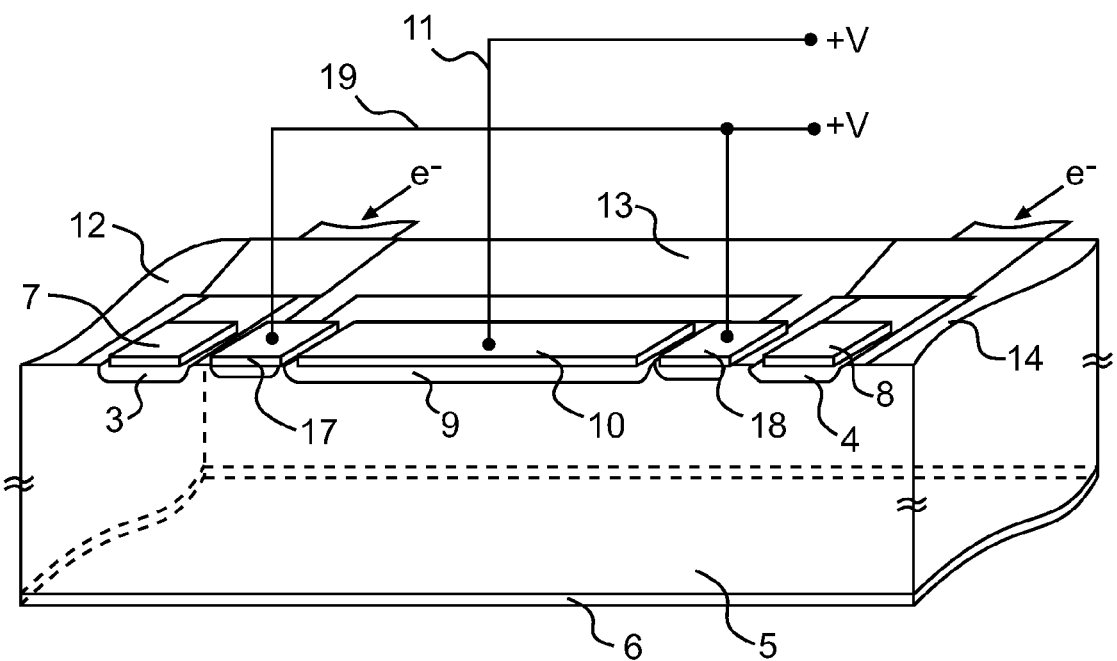
FIG. 2B shows a perspective view of the pnCCD semiconductor detector according to FIG. 1 in a clearing mode in which the collected signal charge carriers are cleared.

There will now be described, with reference to FIG. 2B, a clearing or reset mode in which the collected signal electrons e⁻ are removed from the readout anodes 3, 4 via the clearing contact 9 in order to reset the readout anodes 3, 4 to their original electric potential.

To this end, via the control line 19, a positive electrical voltage +V is applied to the gates 17, 18 over the gaps 15, 16 in the guard rings 12, 14 and generates in the gaps 15, 16 an electron accumulation layer, which creates a conductive passage from the clearing contact 9 to the readout anodes 3, 4, so that the signal electrons e⁻ are conveyed away from the readout anodes 3, 4 via the common clearing contact 9.

To this end, a positive clearing voltage is applied to the clearing contact 9 via the control line 11 in the clearing mode.

The invention is not limited to the preferred example of embodiment described above. Instead, many variants and modifications are possible which likewise make use of the concept of the invention and therefore fall within the scope of protection.

What is claimed is:

1. A semiconductor detector for radiation detection comprising:
   a) a guard ring,
   b) a readout anode arranged inside the guard ring for reading out radiation-generated signal charge carriers,
   c) a clearing contact arranged outside the guard ring for removing collected signal charge carriers from the readout anode,
   d) a gap in the guard ring
   e) a controllable gate which is arranged over the gap in the guard ring and makes the gap in the guard ring permeable or impermeable to the signal charge carriers to be removed, depending on an electrical actuation of the gate;
   f) a CCD detector element for detecting the radiation, wherein the radiation generates the signal charge carriers, and
   g) at least one transport channel which is adapted to transport the signal charge carriers from the CCD detector element to the readout anode.

2. The semiconductor detector according to claim 1, further comprising:
   a) a plurality of guard rings, each with a gap,
   b) a plurality of readout anodes which are in each case arranged in one of the guard rings, and
   c) a plurality of controllable gates which are in each case arranged over gaps in the individual guard rings and make a respective gap permeable or impermeable to the signal charge carriers, depending on electrical actuation of a respective gate.

3. The semiconductor detector according to claim 2, wherein the clearing contact is adapted to remove the signal charge carriers from adjacent readout anodes of the plurality of readout anodes in adjacent guard rings.

4. The semiconductor detector according to claim 3, wherein
   a) the clearing contact is arranged between two adjacent guard rings, and
   b) the gaps in the two adjacent guard rings of the plurality of guard rings face towards one another.

5. The semiconductor detector according to claim 2, wherein the gates are jointly electrically contacted and are at the same potential.

6. The semiconductor detector according to claim 1, further comprising a control unit for electrically actuating the gate and the clearing contact.

7. The semiconductor detector according to claim 6, wherein the control unit actuates both the gate and the clearing contact with a DC voltage signal.

8. The semiconductor detector according to claim 6, wherein the control unit actuates both the gate and the clearing contact with an AC voltage signal.

9. The semiconductor detector according to claim 6, wherein the control unit actuates the clearing contact with a DC voltage signal and the gate with an AC voltage signal.

10. The semiconductor detector according to claim 6, wherein the control unit actuates the clearing contact with an AC voltage signal and the gate with a DC voltage signal.

11. The semiconductor detector according to claim 1, wherein
   a) in order to almost completely remove collected radiation-generated signal charge carriers from the readout anode, a certain clearing time is required in which the gap in the guard ring is permeable to the signal charge carriers, and
   b) the clearing time is less than a limit value selected from the group consisting of 100 ns, 50 ns, 30 ns, 20 ns, 10 ns and 5 ns.

12. The semiconductor detector according to claim 1, further comprising a plurality of transport channels for transporting the radiation-generated signal charge carriers to the respective readout anodes at the end of the transport channels.

13. The semiconductor detector according to claim 1, further comprising an amplifier which is connected to the readout anode.

14. The semiconductor detector according to claim 1, wherein the gate, the readout anode and the clearing contact form a MOSFET transistor with the readout anode as a source and the clearing contact as a drain and the gap in the guard ring as a controllable channel.

15. The semiconductor detector according to claim 14, wherein the MOSFET transistor is normally off.

16. The semiconductor detector according to claim 14, wherein the MOSFET transistor is normally on.

17. The semiconductor detector according to claim 14, wherein the MOSFET transistor is an n-channel MOSFET transistor.

18. The semiconductor detector according to claim 14, wherein the MOSFET transistor is a p-channel MOSFET transistor.

19. The semiconductor detector according to claim 1, wherein the readout anode, the guard ring, the clearing contact and the gate are arranged on a surface of a semiconductor substrate.

20. The semiconductor detector according to claim 1, wherein
   a) the clearing contact, the semiconductor substrate and the readout anode are doped according to a first type of doping, and
   b) the guard ring is doped according to a second type of doping.

21. The semiconductor detector according to claim 20, wherein the first type of doping is an n-doping, while the second type of doping is a p-doping.

22. The semiconductor detector according to claim 20, wherein the first type of doping is a p-doping, while the second type of doping is an n-doping.

* * * * *